US008229709B2

(12) United States Patent
Boufounos

(10) Patent No.: US 8,229,709 B2
(45) Date of Patent: Jul. 24, 2012

(54) METHOD FOR RECONSTRUCTING SPARSE SIGNALS FROM DISTORTED MEASUREMENTS

(75) Inventor: Petros T. Boufounos, Boston, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 389 days.

(21) Appl. No.: 12/609,217

(22) Filed: Oct. 30, 2009

(65) Prior Publication Data

US 2011/0101957 A1    May 5, 2011

(51) Int. Cl.
*G06F 15/00* (2006.01)
*H03F 1/26* (2006.01)

(52) U.S. Cl. ............................ 702/196; 702/189; 703/13

(58) Field of Classification Search ............... 702/119, 702/159, 189, 190, 196, 124; 324/76.12, 324/202, 244, 307, 309; 703/13
See application file for complete search history.

(56) References Cited

U.S. PATENT DOCUMENTS

2011/0022375 A1 * 1/2011 Odille et al. .................... 703/13
* cited by examiner

*Primary Examiner* — John H Le
(74) *Attorney, Agent, or Firm* — Gene Vinokur; Dirk Brinkman

(57) ABSTRACT

A signal x is reconstructed by measuring the signal x as a vector y of measurements $y_i$, wherein the measurements $y_i$ are distorted, and each measurement $y_i$ has an associated value. The measurements $y_i$ in the vector y are ordered according to the associated values, wherein each sorted measurement has an index corresponding to the ordering to form an ordered index sequence. Then, a reconstruction method is applied to the ordered index sequence to produce an estimate $\hat{X}$ of the signal x.

10 Claims, 3 Drawing Sheets

Inputs: Measurement signs $y \in \{\pm 1\}^N$, Measurement matrix $\Phi$, Signal sparsity $K$.
Initialization: Iteration count $l = 0$, Initial $K$-sparse estimate $\widehat{x}^0$ 1: while not converged do
2:    *Increase iteration count:*
$$l \leftarrow l + 1$$
3:    *Compute measurements estimate:*
$$\widetilde{y}^l = \text{diag}(y)\Phi\widehat{x}^{l-1},$$
where $\text{diag}(y)$ is a diagonal matrix with the measured signs. Consistency is achieved when $\widetilde{y}$ has positive elements.
4:    *Identify sign consistencies*
$$r^l = (\widetilde{y}^l)^-,$$
where the function $(\cdot)^-$ is the element-wise negative part of a vector (i.e., sets all the positive elements to 0).
5:    *Compute correction signal:*
$$s^l = \Phi^T \text{diag}(y) r^l$$
6:    *Identify correction support:*
$$T^l = \text{supp}(s^l|_{2K}) \cup \text{supp}(\widehat{x}^{l-1}),$$
where $\text{supp}(\cdot)$ determines the support set of a vector, and $x|_K$ selects the $K$ components of $x$ with the largest magnitude, setting all others to 0.
7:    *Perform Consistent Reconstruction over chosen support:*
$$b^l|_T = \arg\min_x \left\| \left( \text{diag}(y) \Phi x \right)^- \right\|_2^2, \text{ s.t. } \|x\|_2 = 1 \text{ and } x|_{T^c} = 0$$
i.e., minimize the squared norm of the negative (inconsistent) part of the vector subject to the normalization constraint. The optimization is only over the support $T$. Details for this (also non-convex) optimization are presented in the paper.
8:    *Truncate, normalize, and update the estimate:*
$$\widehat{x}^l = \frac{b^l|_K}{\|b^l|_K\|_2}$$

Output: $\widehat{x}^l$

*Fig. 3*
Prior Art

METHOD FOR RECONSTRUCTING SPARSE SIGNALS FROM DISTORTED MEASUREMENTS

FIELD OF THE INVENTION

This invention relates generally to reconstructing sparse signals, and more particularly to reconstructing sparse signals from distorted measurements.

BACKGROUND OF THE INVENTION

To represent a signal without error, the signal must be measured at a rate (the Nyquist rate) that is at least twice the highest frequency. However, certain signals can be compressed after measuring, which wastes resources if the signals are measured at the Nyquist rate, and then compressed.

Instead, compressive sensing (CS) can be used to efficiently acquire and reconstruct signals that are sparse or compressible. CS uses the structure of the signals measures at rates significantly lower than the Nyquist rate to reconstruct. CS can use randomized, linear, or non-adaptive measurements, followed by non-linear reconstruction using convex optimization or greedy searches.

The conventional solution without CS minimizes the $l_2$ norm, i.e., the amount of energy in the system. However, this leads to poor results for most practical applications because it does not take into account the sparsity in the measured signal. The desired CS solution should minimize the $l_0$ norm, which measures this sparsity. However, this is an NP-hard problem. Therefore, the $l_1$ norm is usually minimized, which also promotes sparsity and can be shown to be equivalent to the $l_0$ norm under certain conditions. Finding the candidate with the smallest $l_1$ norm can be expressed as a linear program, for which efficient solutions exist.

Using CS, a signal x with K nonzero coefficients can be reconstructed from linear non-adaptive measurements obtained using $$y=Ax, \quad (1)$$

where A is a measurement matrix. Exact signal reconstruction is guaranteed when the measurement matrix A has a restricted isometry property (RIP). The RIP characterizes matrices, which behave similarly to orthonormal ones, at least when operating on sparse signals. A matrix A has RIP of order 2K if there exists a constant $\delta_{2K}$, such that for all 2K sparse signals z $$(1-\delta_{2K})\|z\|_2^2 \leq \|Az\|_2^2 \leq (1+\delta_{2K})\|z\|_2^2 \quad (2)$$

If $\delta_{2K}$ is small, then the matrix A approximately maintains $l_2$ norm distances between K sparse signals. In this case, a convex optimization reconstructs the signal as $$\hat{x} = \operatorname*{argmin}_{x \in \mathbb{R}^N} \|x\|_1 \text{ subject to } y = Ax. \quad (3)$$

An alternative method uses a greedy sparse reconstruction procedure. Similarly to optimization methods, the guarantees are based on the RIP of the matrix A. Surprisingly, random matrices with a sufficient number of rows can achieve small RIP constants with overwhelming probability. Thus, random matrices are commonly used for CS signal acquisition and reconstruction.

The randomness of the acquisition matrix also ensures a well-formed statistical distribution of the measurements. Specifically, if the matrix has independent and identically distributed (i.i.d.) random entries, then the measurements in the vector y also follow an asymptotic, normal distribution.

Measurements of signals can be quantized to a finite number of bits, e.g., only the most significant (sign) bit. However, reconstruction a signal from quantized measurements is difficult. One method in the art combines the principle of consistent reconstruction with $l_1$ norm minimization on a sphere of unit energy to reconstruct the signal. Specifically, a signal is measured using $$y=\operatorname{sign}(Ax), \quad (4)$$

where $\operatorname{sign}(.)=\pm 1$. The reconstructed signal is consistent with the signs of the measurements.

Because the signs of the measurements eliminate any information about the magnitude of the signal, a constraint of unit energy, $\|x\|_2=1$, is imposed during the reconstruction, i.e., the reconstruction is performed on a unit sphere. Sparsity is enforced by minimizing the $l_1$ norm on the sphere of unit energy.

Consistency with the measurements is imposed by relaxing strict constraints, and introducing a one-sided quadratic penalty when a constraint is violated. This can be expressed as a squared norm of the measurements that violate the constraint. Specifically, the negative part of a scalar is denoted by $(.)^-$, i.e., $$(x)^- = -\min(x, 0) = \frac{|x|-x}{2} = \begin{cases} 0, & \text{if } x \geq 0 \\ -x & \text{otherwise} \end{cases}. \quad (5)$$

Then, the penalty is $$c(\hat{x})=\|(\operatorname{diag}(y)A\hat{x})^-\|_2^2 \quad (6)$$

where $\operatorname{diag}(y)$ is a matrix with the signs of the measurements on the diagonal. The negative operator $(.)^-$ is applied element-wise to identify the constraint violations, and the amplitude of the violation.

An estimate of the signal that is consistent with the measurements produces no constraint violations and the penalty $c(\hat{x})$ is zero. Using Equation (6), the reconstruction problem becomes $$\hat{x} = \operatorname*{argmin}_{x, \|x\|_2=1} \|x\|_1 + \frac{\lambda}{2}\|(\operatorname{diag}(y)A\hat{x})^-\|_2^2. \quad (7)$$

Equation (7) is non-convex, and convergence to a global optimum cannot be guaranteed.

Greedy search procedures attempt to greedily determine a sparse minimum for the penalty function. The Matching Sign Pursuit (MSP) procedure performs an iterative greedy search similar to Compressive Sampling Matching Pursuit (CoSaMP) and the Subspace Pursuit. Specifically, the MSP procedure updates a sparse estimate of the signal x by iteration, see related Application. The MSP modifies CoSaMP significantly to enable reconstruction using only the sign of measurements by enforcing a consistency constraint and an $l_2$ unit energy constraint.

SUMMARY OF THE INVENTION

The embodiments of the invention provide a method for reconstructing a sparse signal from measurements that are distorted nonlinearly, even when the nonlinearity is unknown but monotonic. Since the nonlinearity is monotonic, the method uses reliable information in the distorted measurements, which is an ordering based on the amplitudes of the measurements. The ordered amplitudes are sufficient to reconstruct the sparse signal with a high precision.

One embodiment uses order statistics of the ordered amplitudes to determine a minimum mean square (MMSE) estimate of the undistorted measurements, and use the MMSE with any conventional compressive sensing (CS) reconstruction procedure.

Another embodiment uses a principle of consistent reconstruction in a deterministic nonlinear reconstruction procedure that ensures that the amplitudes of the measurements of the reconstructed signal have an ordering that is consistent with the ordering of the amplitudes of the distorted measurements.

BRIEF DESCRIPTION OF THE DRAWINGS

FIG. 3 is a prior art pseudo code for a Matching Sign Pursuit procedure used by the method described with reference to FIG. 2.

DETAILED DESCRIPTION OF THE PREFERRED EMBODIMENTS

In this description, the following conventional symbols are used above variables. The symbols in the description and claims may be omitted for clarity: "^" estimate, "¯" mean, and "~" working estimate.

Figure 1:
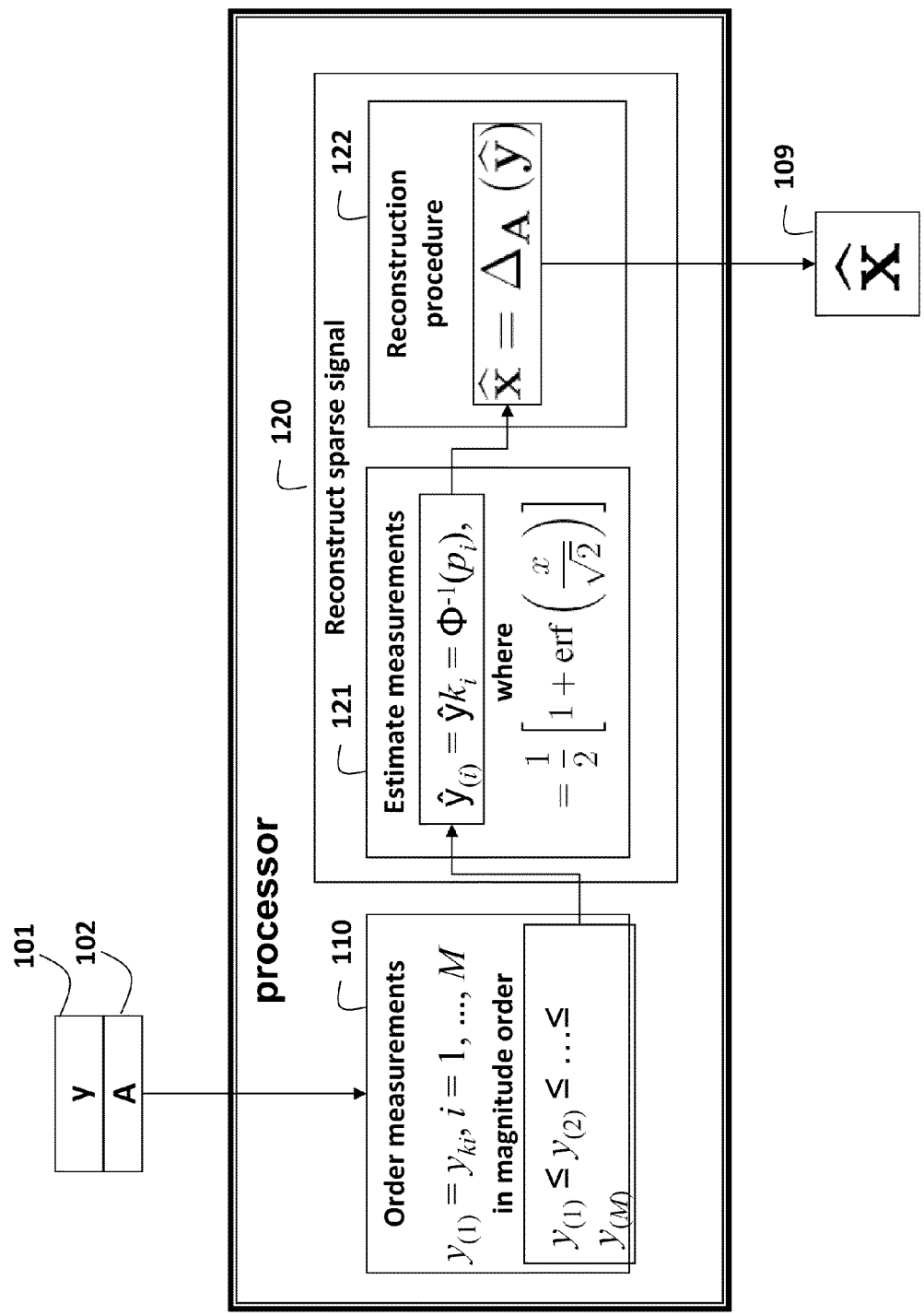
FIG. 1-2 are a flow diagram of a method for reconstructing spare signals based on an ordering of amplitudes of the signals according to embodiments of the invention.

As shown in FIG. 1, one embodiment of the invention provide a method for reconstructing an estimate of $\hat{x}$ 109 a sparse signal from a measurement vector y 101 of the a sparse signal x that is distorted nonlinearly, and a measurement matrix A 102. The steps of the method can be performed in a processor including memory and input/output interfaces as known in the art.

Order Statistics

The measurements $y_i$ in the vector y follow a normal distribution, denoted f(y), which is a cumulative distribution function (CDF), denoted $\Phi(y)$. The CDF indicates the probability that a variable is less than or equal to a given value.

The M measurements $y_i$ 101 are ordered 110 in order of their amplitudes, that is $$y_{(i)} = y_{k_i}, i=1, \ldots, M. \quad (8)$$

The order of the amplitudes can be increasing or decreasing, e.g., $y_{(1)} \leq y_{(2)} \leq \ldots \leq y_{(M)}$. In this ordering, the subscripts (i) are the indices of the ordering and $k_i$ the indices of the corresponding unordered measurements.

The sorted amplitudes form the order statistics of the measurements. Variables $p_i = 1/(M+1)$ and $q_i = 1 - p_i$ asymptotically account for the probabilities of measurements with amplitudes less than and greater than the amplitude of the measurement $y_{(i)}$, respectively.

Generally, moments of the order statistics do not have a closed form. An asymptotically accurate unbiased approximation is $$E(y_{(i)}) = Q(p_i), \quad (9)$$

$$E(y_{(i)} y_{(j)}) = \frac{p_i q_j}{M+2} Q'(p_i) Q'(q_j), \quad (10)$$

where $Q(x) = \Phi^{-1}(x)$ is the inverse of the CDF, often referred to as a quantile function, and $Q'(x)$ is the derivative evaluated at x. The quantile function of a probability distribution returns the value below which random selected values fall $p \times 100\%$ of the time.

Measurement Model

The embodiments of the invention consider linear measurements of the sparse signal x using inner products with rows $a_i$ of the measurement matrix A. The measurements are $$y = g(Ax), \quad (11)$$

where the function g is nonlinearly increasing or decreasing, and applied element—wise to the coefficients of the elements of the signal vector x.

Because the nonlinear distortion is unknown, only limited information is provided by g(.). For example, the unknown distortion g(x) eliminates any amplitude information of the signal x. Thus, the signal x can only be reconstructed within a positive scalar factor. Furthermore, any other monotonic distortion of the measurements can originate from the same signal because the composition of two monotonic functions is also monotonic. The nonlinearity maintains the ordering of the amplitudes of the measurements.

The ordering property is exploited by the invention. From Equation (8) and the ordering property, it follows that $$\text{sign}(y_{(i)} - y_{(j)}) = \text{sign}(i, j). \quad (12)$$

The index sequence $\{k_1, \ldots, k_M\}$ is preserved among all monotonic distortions g(x), including the identity. Furthermore, after the sequence $\{k_i\}$ is known, the exact values of $y_{(i)}$ provide no further information, and are not used during the reconstruction. This is because a nonlinear monotonic distortion that maps $y_{(i)}$ to any other $y'_{(i)}$ that has the same ordering $\{k_i\}$ can always be constructed.

Because elements in the measurement matrix A are random and normally distributed, the undistorted measurements are also random and normally distributed. Asymptotically, this is true even if the matrix entries are random i.i.d., but not normally distributed, due to the central limit theorem.

Measurement Substitution

The statistics of the order of the measurements are used to reconstruct an estimate $\hat{x}$ of the sparse signal x. Because the nonlinearity g(.) is unknown, the ordering of the amplitude of the measurements is the only reliable information obtained from the measurement vector y. Using the randomness and the normality of the undistorted measurements, an estimator for the undistorted measurements is provided.

Instead of using the distorted measurements, the distorted measurements are replaced with the MMSE estimate of the undistorted values, conditioned only on the ordering of the amplitudes of the measurements. The estimator is a function of the measurement ordering $\hat{y}(\{k_i\})$. Specifically the MMSE estimator is the conditional expectation:

$$\hat{y}(\{k_i\}) = E(\hat{y}\{k_i\}). \quad (13)$$

As stated above, the measurement process removes all amplitude information from the signal, other than their order. Thus, the signal can only be identified within a positive scaling factor. Because the reconstructed signal is normalized to have a unit $l_2$ norm, the measurements follow a standard normal distribution.

After the ordering, the reconstruction 120 proceeds as follows. Using the asymptotic approximation of Equation (9) in Equation (13), the estimation 121 of the measurements is according to the inverse CDF $$\hat{y}_{(i)} = \hat{y}_{k_i} = \Phi^{-1}(p_i) \quad (14)$$

where $\Phi(.)$ denotes the inverse CDF of the standard normal distribution $$\Phi(x) = \frac{1}{2}\left[1 + \mathrm{erf}\left(\frac{x}{\sqrt{2}}\right)\right], \qquad (15)$$

where erf is the error function.

The estimated measurements $\hat{y}$ can be used as input to any reconstruction procedure $\Delta_A$ to reconstruct 130 the signal $\hat{x}$ 109 as $$\hat{x} = \Delta_A(\hat{y}).$$

Consistent Reconstruction

Figure 2:
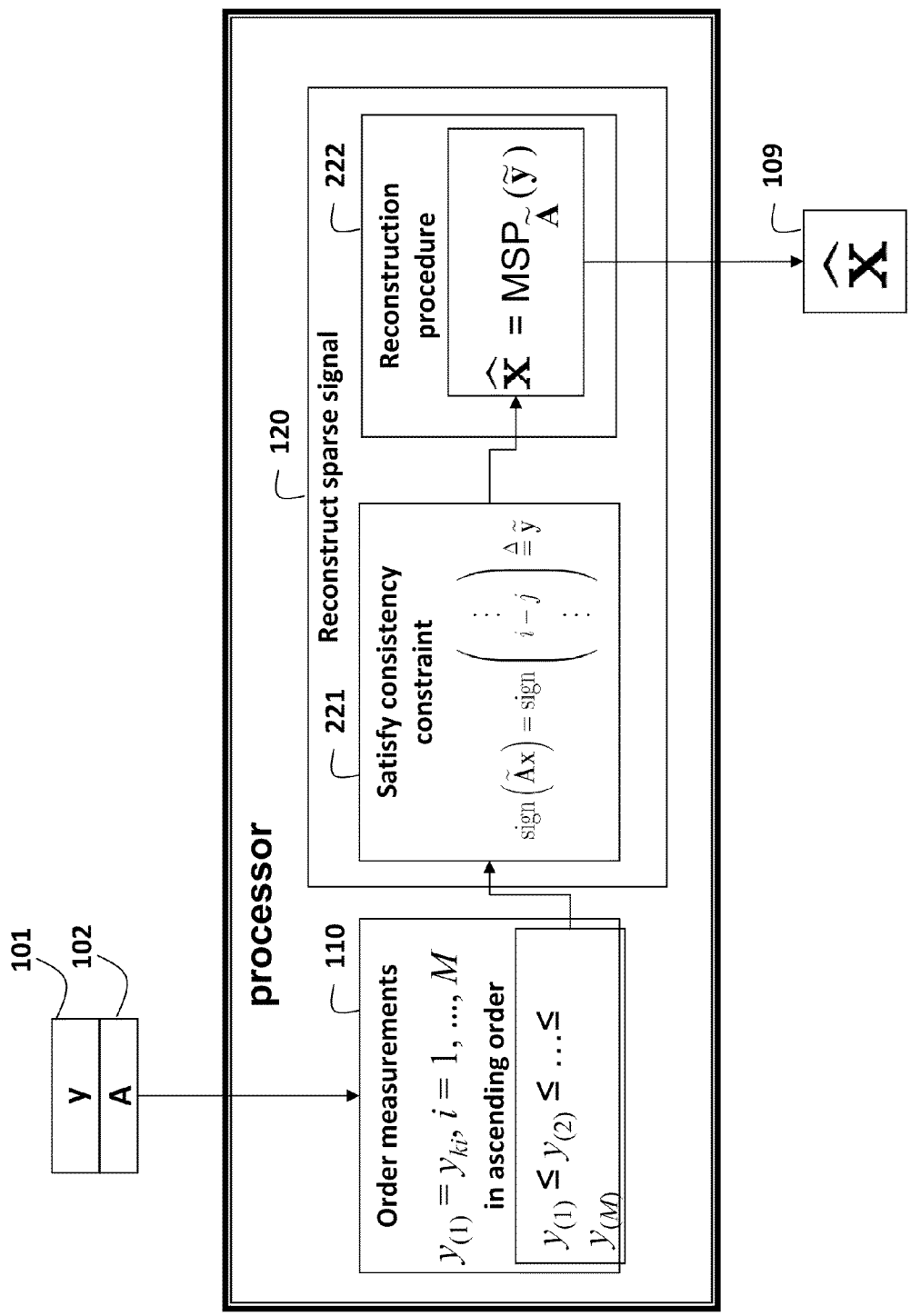

In another embodiment as shown in FIG. 2, a consistent constraint 221 on the ordering of the measurements is satisfied 221 during the reconstruction. The constraint ensures that the measurements of the reconstructed signal have the same ordering as the measurements of the input signal. Therefore, an implicit measurement matrix $\tilde{A}$ can be derived from the matrix A and the ordering of the measurement amplitudes such that $$\tilde{y} = \mathrm{sign}(\tilde{A}x)$$

where $\mathrm{sign}(.) = \pm 1$.

If $a_k$ denotes the $k^{th}$ row of the matrix A, then $$y_{(i)} > y_{(j)} \Leftrightarrow yk_i > yk_j \Leftrightarrow \langle a_{k_i}, x \rangle > \langle a_{k_j}, x \rangle \qquad (16)$$

$$\Leftrightarrow \langle (a_{k_i} - a_{k_j}), x \rangle > 0 \qquad (17)$$

$$\Leftrightarrow \mathrm{sign}(\langle a_{k_i} - a_{k_j}, x \rangle) = \mathrm{sign}(i - j) \qquad (18)$$

where Equation (16) follows from the monotonicity of the nonlinear distortion in Equations (11), and Equation (18) follows from Equation (12), i.e. from the properties of the ordered index sequence $\{k_i\}$.

In other words, the matrix $\tilde{A}$ can be constructed using rows of the matrix A of the form $a_{k_i} - a_{k_j}$ such that the constraint $$\mathrm{sign}(\tilde{A}x) = \mathrm{sign}\begin{pmatrix} \vdots \\ i - j \\ \vdots \end{pmatrix} \stackrel{\Delta}{=} \tilde{y} \qquad (19)$$

is satisfied 221.
For example, $$y = \begin{bmatrix} 1 \\ 5 \\ 3 \end{bmatrix}, \text{ ordered} = \begin{bmatrix} 1 \\ 3 \\ 5 \end{bmatrix}, \text{ and } \tilde{A} = \begin{bmatrix} a_2 - a_3 \\ a_3 - a_1 \\ a_2 - a_1 \end{bmatrix},$$

where i and j are indices of the first and second row respectively.

The matrix $\tilde{A}$ and the corresponding sign measurements are input to the MP procedure, see above, to estimate 222 the sparse signal x as an estimate $$\hat{x} = MSP_{\tilde{A}}(\tilde{y}).$$

Equation (19) holds for index pairs $(k_i, k_j)$ and, therefore, for vector pairs $(a_{k_i}, a_{k_j})$ selected to construct the matrix $\tilde{A}$. Using the (M−1) pairs $(k_{i+1}, k_i)$, for i=1, ..., M−1 guarantees that the reconstruction is consistent with every pair $(k_i, k_j)$. This is the recommended approach. However, it is possible to use other design choices. The design is equivalent to selecting pairs $(k_i, k_j)$ of rows of the matrix A that are used to construct the rows of the matrix $\tilde{A}$.

The initial seed value for the reconstruction is another design choice. Because this embodiment attempts to solve a non-convex problem, a correct initial value facilitates convergence to a global optimum. Even though the MSP procedure has better convergence performance than the $l_1$ optimization on the unit sphere described in the prior art, convergence issues can still exist if the number of measurements M is small. Thus, to improve convergence, measurement substitution and/or a few iterations of a conventional CS decoding can be used to provide the initial value.

Matching Pursuit Procedure

FIG. 3 shows the steps of the MP procedure described with reference to FIG. 2. The MSP procedure uses a greedy search that attempts to find a sparse minimum to the penalty function in Equation (6).

Specifically, the MSP procedure updates a sparse estimate of the signal $\hat{x}$ using the following iteration:
 steps 3 and 4 identify sign constraints that are violated;
 steps 5 and 6 identify the signal components mostly effective in minimizing the cost function and reducing the sign violations
 step 7 minimizes the cost function over those signal components; and
 step 8 truncates the signal to the desired sparsity, normalizes, and updates the estimate.

EFFECT OF THE INVENTION

The embodiments of the invention reconstruct a sparse signal subject to an unknown monotonic nonlinear distortion of measurements. Surprisingly, the distortion maintains sufficient information to reconstruct the signal. The key idea is that a relative ordering of signal values is preserved because the distortion is monotonic. The ordering preserves sufficient information for the signal reconstruction.

One embodiment uses a statistical framework that estimates undistorted measurements using order statistics of the distorted measurements. The measurements can be input to any reconstruction procedure to reconstruct the signal.

Another embodiment uses a deterministic framework that directly incorporates the ordering information in the reconstruction procedure. In this framework, a greedy reconstruction procedure produces a signal estimate consistent with the information in the measurement ordering.

Both embodiments have better performance than conventional CS reconstruction of distorted measurements.

One idea is to exploit the randomized measurement process. Randomization makes individual measurements normally distributed, random variables. Standard estimation theory is combined with order statistics to determine a minimum mean squared error (MMSE) estimate of the undistorted measurements. The estimate is based only on the ordering of the distorted measurements. No assumption is made on the signal structure, or the reconstruction procedure. Although the invention is described in the context of CS, the invention can also be used to reconstruct a variety of signals from randomized distorted measurements of the signals using an appropriate reconstruction procedure.

Another idea is to use nonlinear reconstruction, which incorporates the ordering of the measurements as a constraint in the reconstruction process. Thus, in addition to prior knowledge of the signal structure, the invention also exploits knowledge of the measurement system.

Applications for the invention are numerous. Drift and variations of nonlinear properties of measurement devices are common in most acquisition systems, and vary due to manufacturing and runtime conditions. For example, in optical systems, the operating temperature and ambient light can make the device drift to a nonlinear region of the acquisition.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

I claim:

1. A method for reconstructing a signal x, comprising the steps of:
    measuring a signal x as a vector y of measurements $y_i$, wherein the measurements $y_i$ are distorted, and each measurement $y_i$ has an associated value;
    ordering the measurements $y_i$ in the vector y according to the associated values, wherein each sorted measurement has an index corresponding to the ordering to form an ordered index sequence; and
    applying a reconstruction method to the ordered index sequence to produce an estimate $\hat{x}$ of the signal x, wherein the signal x is sparse, wherein the steps are performed in a processor.

2. The method of claim 1, wherein the distortion is nonlinear and unknown.

3. The method of claim 2, wherein the nonlinearity is monotonic.

4. The method of claim 1, wherein the measurements $y_i$ in the vector y follow a normal distribution f(y), which is a cumulative distribution function (CDF) $\Phi(y)$.

5. The method of claim 4, wherein a number of the measurements is M, and wherein the applying further comprises: estimating measurements $\hat{y}$ according to $\hat{y}_{(i)} = \hat{y}_{k_i} = \Phi^{-1}(p_i)$, wherein $p_i = i/(M+1)$, and the compressive reconstruction is $\hat{x} = \Delta_A(\hat{y})$, wherein $\Delta_A$ is a reconstruction procedure.

6. The method of claim 1, wherein the ordering is increasing.

7. The method of claim 1, wherein the ordering is decreasing.

8. The method of claim 1, wherein the measuring is according to $$y = g(Ax),$$

wherein A is a measurement matrix, and wherein the function g is nonlinearly increasing or decreasing and applied element-wise to the signal x.

9. The method of claim 8, wherein the applying further comprises:
    satisfying a consistent constraint $$\operatorname{sign}(\tilde{A}x) = \operatorname{sign}\begin{pmatrix} \vdots \\ i-j \\ \vdots \end{pmatrix} \triangleq \tilde{y}$$

to the ordering of the measurements $y_i$, wherein $\tilde{A}$ is a measurement matrix, and wherein sign(.)=±1, and i and j are indices of a first and a second row of the measurement matrix A used to form the matrix $\tilde{A}$, and the compressive reconstruction is
    $\hat{x} = \operatorname{MSP}_{\tilde{A}}(\hat{y})$, wherein MSP is a Matching Sign Pursuit procedure.

10. The method of claim 1, wherein the values are amplitudes of the signal x.

* * * * *